(12) United States Patent
Kadoguchi

(10) Patent No.: US 11,195,815 B2
(45) Date of Patent: Dec. 7, 2021

(54) SEMICONDUCTOR DEVICE AND MANUFACTURING METHOD THEREOF WITH CU AND SN INTERMETALLIC COMPOUND

(71) Applicant: DENSO CORPORATION, Kariya (JP)

(72) Inventor: Takuya Kadoguchi, Toyota (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/722,144

(22) Filed: Dec. 20, 2019

(65) Prior Publication Data

US 2020/0227380 A1 Jul. 16, 2020

(30) Foreign Application Priority Data

Jan. 11, 2019 (JP) .............................. JP2019-003744

(51) Int. Cl.
*H01L 23/00* (2006.01)

(52) U.S. Cl.
CPC .............. *H01L 24/83* (2013.01); *H01L 24/29* (2013.01); *H01L 2224/83095* (2013.01); *H01L 2924/0105* (2013.01); *H01L 2924/01028* (2013.01); *H01L 2924/01029* (2013.01)

(58) Field of Classification Search
CPC ..................... H01L 24/83; H01L 24/29; H01L 2224/83095; H01L 2924/01028; H01L 2924/01029; H01L 2924/0105

See application file for complete search history.

(56) References Cited

U.S. PATENT DOCUMENTS

| 6,147,403 | A | * | 11/2000 | Matschitsch | ............ H01L 24/05 257/751 |
| 9,659,892 | B2 | * | 5/2017 | Kadoguchi | ............. H01L 24/81 |
| 2005/0151254 | A1 | * | 7/2005 | Narazaki | ............. H01L 23/4827 257/745 |
| 2006/0051898 | A1 | * | 3/2006 | Lu | .......................... H01L 24/32 438/121 |
| 2007/0057021 | A1 | | 3/2007 | Ikeda et al. | |
| 2016/0126204 | A1 | | 5/2016 | Kadoguchi et al. | |
| 2017/0012016 | A1 | * | 1/2017 | Joshi | ....................... H01L 23/00 |
| 2017/0232562 | A1 | * | 8/2017 | Maeno | ............... B23K 35/0238 228/262.61 |
| 2019/0279943 | A1 | * | 9/2019 | Soda | ....................... H01L 21/52 |

FOREIGN PATENT DOCUMENTS

| JP | 2009-076611 A | 4/2009 |
| JP | 2010-226115 A | 10/2010 |
| JP | 4569423 B2 | 10/2010 |
| JP | 2013-197427 A | 9/2013 |
| JP | 2016-092064 A | 5/2016 |

* cited by examiner

*Primary Examiner* — Douglas W Owens
(74) *Attorney, Agent, or Firm* — Sughrue Mion, PLLC

(57) ABSTRACT

A method of manufacturing a semiconductor device which includes a plurality of members including a semiconductor element is provided. The method may include disposing one surface of a first member which is one of the plurality of members and one surface of a second member which is another one of the plurality of members opposite to each other with a tin-based (Sn-based) solder material interposed therebetween, and bonding the first member and the second member by melting and solidifying the Sn-based solder material. At least the one surface of the first member may be constituted of a nickel-based (Ni-based) metal, and at least the one surface of the second member may be constituted of copper (Cu).

8 Claims, 8 Drawing Sheets

Sample a (175°C, 1000h)

Sample b (175°C, 1000h)

Sample b (200°C, 1000h)

SEMICONDUCTOR DEVICE AND MANUFACTURING METHOD THEREOF WITH CU AND SN INTERMETALLIC COMPOUND

CROSS-REFERENCE TO RELATED APPLICATION

This application claims priority to Japanese Patent Application No. 2019-003744, filed on Jan. 11, 2019, the entire contents of which are incorporated herein by reference.

TECHNICAL HELD

The disclosure herewith relates to a semiconductor device and a manufacturing method thereof.

BACKGROUND

In a semiconductor device, two or more members, such as a semiconductor element and a lead frame, are bonded with solder. In case of bonding two members with solder, a surface of the member to be bonded is provided with a nickel (Ni) film such as Ni plating conventionally, so as to improve, for example, solderability. However, if this Ni film is, for example, exposed to a high temperature for a long time period during use of the semiconductor device, it may disappear while generating an intermetallic compound (e.g., $Ni_3Sn_4$) between the Ni film itself and the solder. In this case, bonding strength between the member and the solder decreases.

Japanese Patent Application Publication No. 2016-92064 describes a semiconductor device in which a semiconductor element and a member are bonded with solder mainly constituted of tin (Sn). A method of manufacturing this semiconductor device includes: preparing the semiconductor element and the member that has one surface thereof provided with a Ni film that has its surface provided with, a copper (Cu) layer; disposing a solder material between the Cu layer and the semiconductor element; and bonding the semiconductor element and the member by melting and solidifying the solder material.

In the above-described manufacturing method, when the melted solder material solidifies, Cu in the Cu layer and Sn in the solder material generate $Cu_6Sn_5$ on the surface of the Ni film. The generation of $Cu_6Sn_5$ on the surface of the Ni film suppresses interdiffusion of Ni atoms in the Ni film and Sn atoms in the solder material. Due to this, the Ni film can be suppressed from turning into an intermetallic compound.

SUMMARY

In the manufacturing method in Japanese Patent Application Publication No. 2016-92064, supply of Cu from the Cu layer, which is provided on the surface of the Ni film, allows generation of $Cu_6Sn_5$ on the surface of the Ni film. Depending on conditions such as a melting temperature and a melting time of the solder material, Cu in the Cu Layer may not be completely exhausted and the Cu layer may remain. The present disclosure provides a method of manufacturing a semiconductor device, which is capable of suppressing diffusion of a metal of a surface of a member used in the semiconductor device by using an approach different from that of Japanese Patent Application Publication No. 2016-92064. The present disclosure also discloses the semiconductor device itself.

The present disclosure discloses a method of manufacturing a semiconductor device which comprises a plurality of members including a semiconductor element. The method may comprise disposing one surface of a first member which is one of the plurality of members and one surface of a second member which is another one of the plurality of members opposite to each other with a tin-based (Sn-based) solder material interposed therebetween, and bonding the first member and the second member by melting and solidifying the Sn-based solder material, At least the one surface of the first member may be constituted of a nickel-based (Ni-based) metal, and at least the one surface of the second member may be constituted of copper (Cu).

In the above-described manufacturing method, the one surface of the first member which is constituted of the Ni-based metal and the one surface of the second member which is constituted of Cu are disposed opposite to each other with the Sn-based solder material interposed therebetween. The first member and the second member are then bonded by the Sn-based solder material being melted and solidified. In this manufacturing method, while the Sn-based solder material is melted in the bonding of the first member and the second member, Cu dissolves from the one surface of the second member constituted of Cu into the Sn-based solder material. The dissolution of Cu into the Sn-based solder material generates an intermetallic compound containing Cu and Sn on the one surface of the first member constituted of the Ni-based metal, while the Sn-based solder material solidifies. Moreover, while the Sn-based solder material solidifies, an intermetallic compound containing Cu and Sn is also generated on the one surface of the second member.

As such, in the above-described manufacturing method, Cu is supplied from the one surface of the second member, which is a member to be bonded. Due to this, the intermetallic compound containing Cu and Sn is generated on the one surface of the first member constituted of the Ni-based metal. Moreover, the intermetallic compound containing Cu and Sn is also generated on the one surface of the second member constituted of Cu. Thus, there is no need to separately provide a Cu layer that serves as a Cu source in the above-described manufacturing method, unlike the technology in Japanese Patent Application Publication No, 2016-92064. Therefore, the intermetallic compounds containing Cu and Sn can be generated more easily on the surfaces of the members. Thus, diffusion of metal atoms from the surfaces of the members can be suppressed by the intermetallic compounds.

A semiconductor device disclosed herein may comprise a first member including one surface which is constituted of a nickel-based (Ni-based) metal, a second member including one surface which is constituted of copper (Cu), and a tin-based (Sn-based) solder layer bonding the one surface of the first member and the one surface of the second member. A layer constituted of $(Cu,Ni)_6Sn_5$ may be provided between the one surface of the first member and the Sn-based solder layer. A concentration of Cu in the Sn-based solder layer may be 0.7 mass % or more.

Another semiconductor device disclosed herein may comprise a first member including one surface which is constituted of a nickel-based (Ni-based) metal, a second member including one surface which is constituted of a copper (Cu), and a tin-based (Sn-based) solder layer bonding the one surface of the first member and the one surface of the second member. A layer constituted of $Cu_3Sn$ and a layer constituted of $(Cu,Ni)_6Sn_5$ may be provided in this order from a second member side between the one surface of the second member and the Sn-based solder layer.

The term "solder material" used herein means a material that has not been melted yet but is to be incited for bonding two members. In contrast to this, the term "solder layer" used herein means a bonding layer that bonds two members and is in a state after having bonded the two members (i.e., after solidification of the solder material).

DETAILED DESCRIPTION

Figure 1:
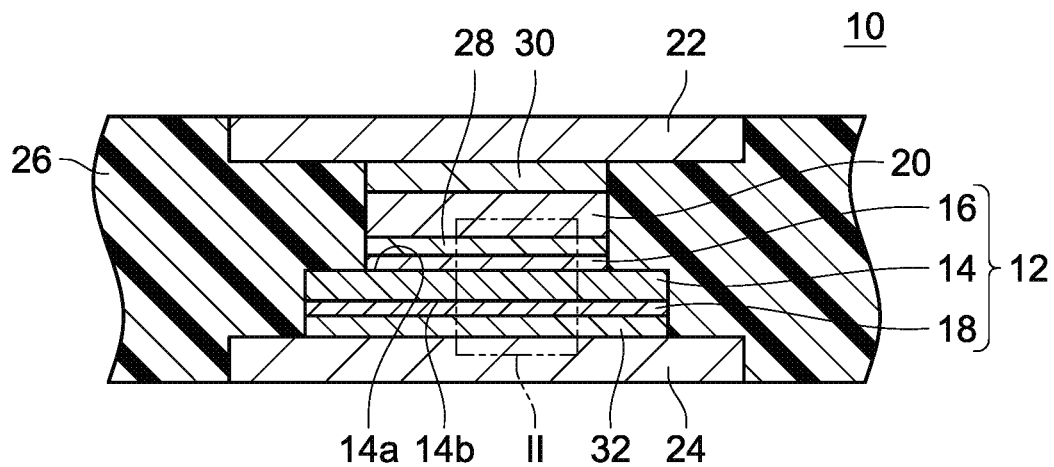
FIG. 1 is a cross-sectional view of a semiconductor device 10 according to an embodiment.

In an embodiment of the present technology, in bonding the first member and the second member, $(Cu,Ni)_6Sn_5$ may be generated on the one surface of the first member while the Sn-based solder material solidifies. While the Sn-based solder material is melted in the bonding of the first member and the second member, Ni dissolves into the Sn-based solder material from the one surface of the first member constituted of the Ni-based metal. The dissolution of Ni into the Sn-based solder material allows Ni atoms to substitute a, part of Cu atoms in an intermetallic compound that contains Cu and Sn and is generated on the one surface of the first member, while the Sn-based solder material solidifies. Namely, $(Cu,Ni)_6Sn_5$ is generated on the one surface of the first member. This can suitably suppress interdiffusion of Ni atoms that constitute the one surface of the first member and Sn atoms that constitute the Sn-based solder material.

In an embodiment of the present technology, in bonding the first member and the second member, $Cu_3Sn$ and $(Cu,Ni)_6S_5$ may be generated in this order on the one surface of the second member while the Su-based solder material solidifies. While the Sn-based solder material is melted in the bonding of the first member and the second member, Ni dissolves into the Sn-based solder material from the one surface of the first member constituted of the Ni-based metal. The dissolution of Ni into the Sn-based solder material allows Ni atoms to substitute a part of Cu atoms in an intermetallic compound that contains Cu and Sn and is generated on the one surface of the second member, while the En-based solder material solidifies. Namely, $Cu_3Sn$ and $(Cu,Ni)_6Sn_5$ are generated on the one surface of the second member. This $(Cu,Ni)_6Sn_5$ covers $Cu_3Sn$ and thereby suppresses growth of $Cu_3Sn$. This can suitably suppress diffusion of Cu atoms that constitute the one surface of the second member.

In an embodiment of the present technology, bonding the first member and the second member may include holding a temperature of the Sn-based solder material for a predetermined time period within a temperature range higher than a melting temperature of the Sn-based solder material. In the bonding of the first member and the second member, Cu dissolves into the Sn-based solder material from the one surface of the second member while the Sn-based solder material is melted. Therefore, the above-described holding of the temperature of the Sn-based solder material enables Cu to be appropriately dissolved into the Sn-based solder material.

In an embodiment of the present technology, in holding the temperature of the Sn-based solder material, a concentration of Cu in the Sn-based solder material may be increased by dissolving copper from the one surface of the second member into melted Sn-based solder material. An amount of $(Cu_9Ni)_6Sn_5$ generated when the Sn-based solder material solidifies becomes larger with higher concentration of Cu in the Sn-based solder material. Therefore, $(Cu,Ni)_6Sn_5$ can be appropriately generated by increasing the dissolution amount of Cu into the Sn-based solder material in the above-described holding of the temperature of the Sn-based solder material.

In an embodiment of the present technology, holding the temperature of the Sn-based solder material may be performed under a condition that the concentration of Cu in the Su-based solder material reaches 0.7 mass % or more. When the concentration of Cu is 0.7 mass % or more in the Sn-based solder material, a layer constituted of $(Cu,Ni)_6Sn_5$ can be sufficiently generated between the Ni-based metal and the Sn-based solder material. Namely, in the bonding of the first member and the second member, interdiffusion of Ni atoms in the Ni-based metal and Sn atoms in the Sn-based solder material (i.e., generation of an intermetallic, compound of Ni and Sn) can be suppressed.

In an embodiment of the present technology, holding the temperature of the Sn-based solder material may be performed under a condition that the concentration of Cu in the Sn-based solder material reaches 3.0 mass % or more.

According to such a configuration, a large amount of Cu is supplied to the Sn-based solder material in the holding of the temperature of the Sn-based solder material, and hence the concentration of Cu in the Sn-based solder material can be maintained at approximately 0.7 mass % or more until the subsequent bonding of the first member and the second member is completed. Therefore, interdiffusion of Ni atoms in the Ni-based metal and Sn atoms in the Sn-based solder material (i.e., generation of an intermetallic compound of Ni and Sn) can be further suppressed almost throughout the bonding of the first member and the second member.

In an embodiment of the present technology, the first member may be the semiconductor element including an electrode, and the one surface of the first member may be a surface of the electrode of the semiconductor element.

Representative, non-limiting examples of the present disclosure will now be described in further detail with reference to the attached drawings. This detailed description is merely intended to teach a person of skill in the art further details for practicing preferred aspects of the present teachings and is not intended to limit the scope of the present disclosure. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

EMBODIMENT

With reference to the drawings, a semiconductor device 10 of an embodiment will be described. As shown in FIG. 1, the semiconductor device 10 includes a semiconductor element 12, a conductor spacer 20, an upper lead frame 22, a lower lead frame 24, and an insulating resin 26.

The semiconductor element 12 includes a semiconductor substrate 14, an upper electrode 16, and a lower electrode 18. In the present embodiment, the semiconductor element 12 is a Reverse Conducting-Insulated Gate Bipolar Transistor (RC-IGBT). However, the semiconductor element 12 is not limited to an RC-IGBT, and it may be a Metal-Oxide-Semiconductor Field-Effect Transistor (MOSFET), a diode, or the like. The semiconductor substrate 14 can be constituted of any of various semiconductor materials, such as silicon (Si), silicon carbide (SiC), or gallium nitride (GaN).

The upper electrode 16 is provided on an upper surface 14a of the semiconductor substrate 14. The lower electrode 18 is provided on a lower surface 14b of the semiconductor substrate 14. The upper electrode 16 and the lower electrode 18 are constituted of a nickel-based (Ni-based) metal. Here, the Ni-based metal means any metal mainly constituted of Ni, and it may be, for example, Ni—P electroless plating or Ni electrolytic plating. The upper electrode 16 only needs to be constituted of the Ni-based metal in a range thereof exposed at its upper surface, and the lower electrode 18 only needs to be constituted of the Ni-based metal in a range thereof exposed at its lower surface. Namely, each of the upper electrode 16 and the lower electrode 18 may include a laminated structure configured of an Ni-based metal layer and another metal layer such as an aluminum (Al) or aluminum silicon (AlSi) layer.

The conductor spacer 20 is disposed above the semiconductor element 12. The conductor spacer 20 has its lower surface connected to an upper surface of the semiconductor element 12 (specifically, the upper surface of the upper electrode 16) via a solder layer 28. The conductor spacer 20 is constituted of copper (Cu). The conductor spacer 20 only needs to be constituted of Cu at least at its lower surface.

The upper lead frame 22 is disposed above the conductor spacer 20. The upper lead frame 22 has its lower surface connected to an upper surface of the conductor spacer 20 via a solder layer 30. The upper lead frame 22 is constituted of Cu. The upper lead frame 22 only needs to be constituted of Cu at least at its lower surface.

The lower lead frame 24 is disposed below the semiconductor element 12. The lower lead frame 24 has its upper surface connected to a lower surface of the semiconductor element 12 (specifically, the lower surface of the lower electrode 18) via a solder layer 32. The lower lead frame 24 is constituted of Cu. The lower lead frame 24 only needs to be constituted of Cu at least at its upper surface.

The solder layers 28, 30, 32 are constituted of an Sn—Cu-based metal in which Cu has been added to tin (Sn). A concentration of Cu in each of the solder layers 28, 30, 32 is, for example, 0.7 mass % or more, but it is not particularly limited thereto. Alternatively, the concentration of Cu may be, for example, 1.0 mass % or more, 1.5 mass % or more, 2.0 mass % or more, 2.5 mass % or more, or 3.0 mass % or more.

Figure 2:
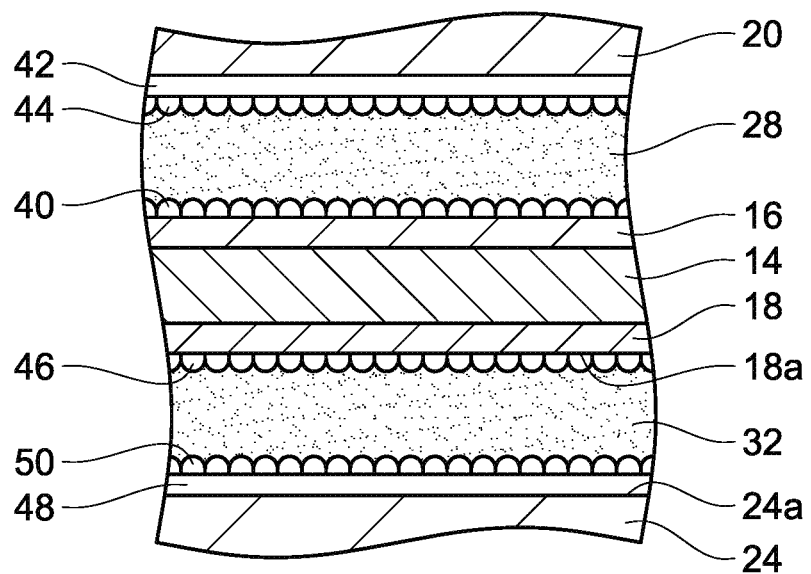
FIG. 2 is an enlarged view schematically showing a configuration of a dashed-line rectangular region II in FIG. 1.

FIG. 2 is an enlarged view schematically showing a configuration of a dashed-line rectangular region 11 in FIG. 1. As shown in FIG. 2, between the upper electrode 16 and the solder layer 28, a first compound layer 40 is provided. In other words, the first compound layer 40 is provided on the Ni-based metal that constitutes the upper surface of the upper electrode 16. The first compound layer 40 is constituted of $(Cu,Ni)_6Sn_5$. Moreover, between the conductor spacer 20 and the solder layer 28, a second compound layer 42 and a third compound layer 44 are provided. The second compound layer 42 is provided on the lower surface of the conductor spacer 20, and the third compound layer 44 is provided on a lower surface of the second compound layer 42. The second compound layer 42 is constituted of $Cu_3Sn$. The third compound layer 44 is constituted of $(Cu,Ni)_6Sn_5$.

Between the lower electrode 18 and the solder layer 32, a fourth compound layer 46 is provided. In other words, the fourth compound layer 46 is provided on the Ni-based metal that constitutes the lower surface of the lower electrode 18. The fourth compound layer 46 is constituted of $(Cu,Ni)_6Sn_5$. Moreover, between the lower lead frame 24 and the solder layer 32, a fifth compound layer 48 and a sixth compound layer 50 are provided. The fifth compound layer 48 is provided on the upper surface of the lower lead frame 24, and the sixth compound layer 50 is provided on an upper surface of the fifth compound layer 48. The fifth compound layer 48 is constituted of $Cu_3Sn$. The sixth compound layer 50 is constituted of $(Cu,Ni)_6Sn_5$.

As shown in FIG. 1, a laminate configured of the upper lead frame 22, the conductor spacer 20, the semiconductor element 12, and the lower lead frame 24 is covered with the insulating resin 26. An entirety of a surface of the laminate, except for an upper surface of the upper lead frame 22 and a lower surface of the lower lead frame 24, is covered with the insulating resin 26. The insulating resin 26 is constituted of a thermosetting resin, such as an epoxy resin. The upper surface of the upper lead frame 22 and the lower surface of the lower lead frame 24 are connected to a cooler (not shown). Namely, the semiconductor device 10 of the present embodiment includes a so-called double-sided cooling structure that enables cooling from upper and lower surfaces of the insulating resin 26. The semiconductor device 10 may include a one-sided cooling structure in which either the upper surface of the upper lead frame 22 or the lower surface of the lower lead frame 24 is exposed from the insulating resin 26.

Next, with reference to FIGS. 3 to 6, a method of manufacturing the semiconductor device 10 will be described. In particular, a method of bonding the semiconductor element 12 and the conductor spacer 20 with solder will hereinafter be described. A method of bonding the semiconductor element 12 and the lower lead frame 24 in FIG. 1 is similar to the method of bonding the semiconductor element 12 and the conductor spacer 20, and hence the description thereof will be omitted. Moreover, the conductor spacer 20 and the upper lead frame 22 may be bonded according to the method described below, or may be bonded according to a conventionally known method.

Figure 3:
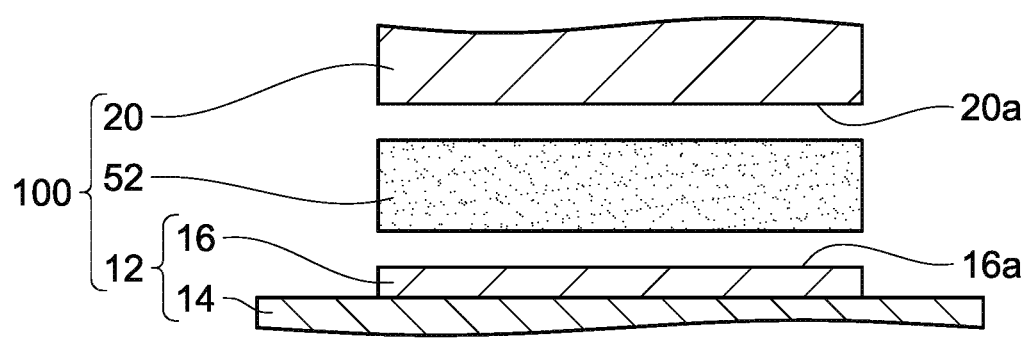
FIG. 3 is a diagram for describing a step of bonding a semiconductor element 12 and a conductor spacer 20.

Firstly, as shown in FIG. 3, the semiconductor element 12 and the conductor spacer 20 are disposed opposite to each other with an Sn-based solder material 52 interposed therebetween. Specifically, the semiconductor element 12 and the conductor spacer 20 are disposed, with an upper surface (Ni-based metal) 16a of the upper electrode 16 of the semiconductor element 12 opposite to a lower surface 20a of the conductor spacer 20 with the Sn-based solder material 52 interposed therebetween. Here, the term "Sn-based solder material" means a solder material mainly constituted of Sn and is, for example, a solder material in which a predetermined amount of Cu has been added to Sn. A concentration of Cu in the Sn-based solder material 52 may be lower than a concentration of Cu in a conventional solder material, which will be described in detail later. Moreover, the Sn-based solder material 52 may not contain Cu. The upper surface 16a of the upper electrode 16 may be covered with another metal film such as a gold (Au) or silver (Ag) film, so as to prevent corrosion of the Ni-based metal. In a subsequent bonding step, such a metal film diffuses into the Sn-based solder material 52 while the Sn-based solder material 52 is melted.

Figure 4:
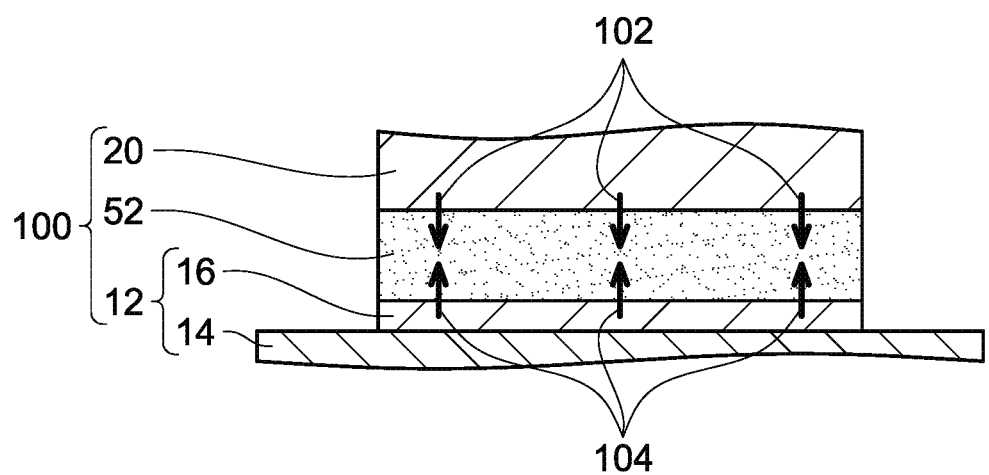
FIG. 4 is a diagram for describing the step of bonding the semiconductor element 12 and the conductor spacer 20.

Next, the bonding step is performed on a laminate 100 configured of the semiconductor element 12, the Sn-based solder material 52, and the conductor spacer 20. In the bonding step, the laminate 100 is firstly heated as shown in FIG. 4. The laminate 100 is heated to a predetermined temperature such that the Sn-based solder material 52 is melted. Namely, the Sn-based solder material 52 is heated to its melting temperature (liquid phase point) or higher. Before heated to the melting temperature or higher, the laminate 100 may be heated for a certain time period at a temperature slightly lower than the melting temperature. Namely, a pre-bonding step, in which the laminate 100 is warmed until an entirety of the laminate 100 has an approximately uniform temperature, may be performed. By performing the pre-bonding step, the Sn-based solder material 52 is less likely to have a temperature difference therein when heated to its melting temperature or higher, and can be melted at an approximately uniform temperature.

When the Sn-based solder material 52 is melted, Cu starts dissolving into the Sn-based solder material 52 from the lower surface 20a of the conductor spacer 20, as shown by arrows 102 in FIG. 4. Moreover, when the Sn-based solder material 52 is melted, the Ni-based metal starts dissolving into the Sn-based solder material 52 from the upper surface 16a of the upper electrode 16 of the semiconductor element 12, as shown by arrows 104 in FIG. 4. Melting points of Cu and the Ni-based metal are higher than the melting temperature of the Sn-based solder material 52. However, when the Sn-based solder material 52 is melted, Cu and the Ni-based metal that are in contact with the Sn-based solder material 52 start dissolving into the Sn-based solder material 52. Specifically, if the Sn-based solder material 52 is melted at a predetermined temperature, Cu and the Ni-based metal continue to dissolve into the Sn-based solder material 52 until they saturate the Sn-based solder material 52 at the predetermined temperature. Here, a temperature at which the Sn-based solder material 52 is in a melted state (hereinafter termed a heating temperature) is held until a dissolution amount of Cu into the Sn-based solder material 52 reaches a predetermined value. For example, the heating temperature is held until the concentration of Cu in the Sn-based solder material 52 reaches 3.0 mass %. Alternatively, the heating temperature may be held until the concentration of Cu reaches, for example, 3.5 mass %, 4.0 mass %, 4.5 mass %, or 5.0 mass %.

Figure 5:
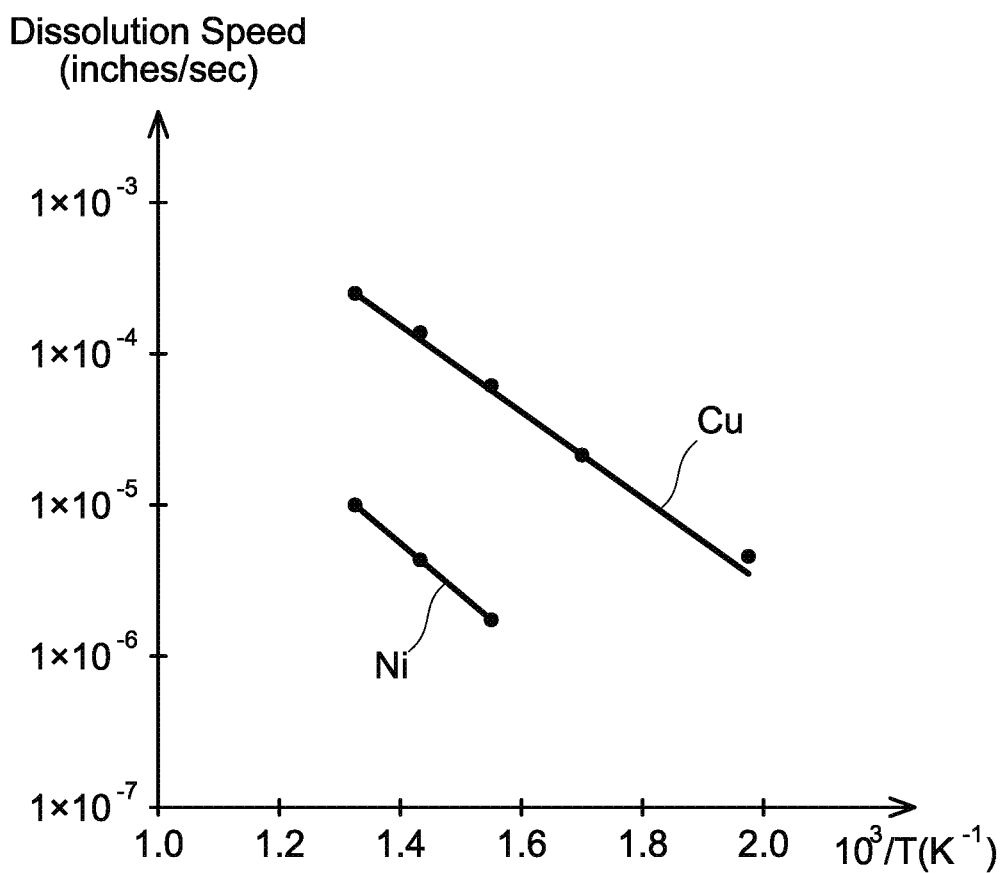
FIG. 5 is a graph showing dissolution speeds of Cu and Ni into an Sn-based solder material.

FIG. 5 shows dissolution speeds of Cu and Ni into the Sn-based solder material 52 at each temperature T. As shown in FIG. 5, the dissolution speed of Cu is approximately 40 times the dissolution speed of Ni. Since the dissolution speed of Cu is higher than the dissolution speed of the Ni-based metal, the dissolution amount of Cu into the Sn-based solder material 52 from the conductor spacer 20 becomes larger than the dissolution amount of the Ni-based metal into the Sn-based solder material 52 from the upper electrode 16. Therefore, the dissolution amount of the Ni-based metal into the Sn-based solder material 52 is relatively small. As shown in FIG. 5, in a case where the Sn-based solder material 52 is melted at approximately 230° C., the dissolution speed of Cu is approximately 0.1 µm/sec, for example. Therefore, in the case of the present embodiment, holding the temperature at approximately 230° C. for about 40 seconds enables the dissolution amount of Cu into the Sn-based solder material 52 to be approximately 3.0 mass %. Moreover, in a case where the Sn-based solder material 52 is melted at approximately 300° C., the dissolution speed of Cu is approximately 0.4 µm/sec, for example. Therefore, in the case of the present embodiment, holding the temperature at approximately 300'C. for about 10 seconds enables the dissolution amount of Cu into the Sn-based solder material 52 to be approximately 3.0 mass %. As such, the heating temperature and the time period for holding the heating temperature can be set appropriately to allow the concentration of Cu in the Sn-based solder material 52 to reach a desired value.

Figure 6:
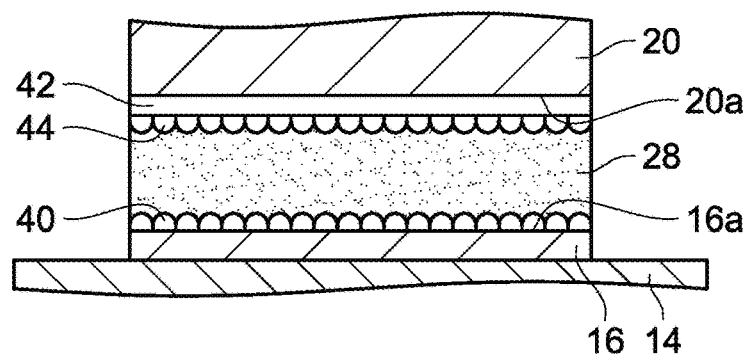
FIG. 6 is a diagram for describing the the step of bonding the semiconductor element 12 and the conductor spacer 20.

Next, the heat is removed from the laminate 100 to solidify the Sn-based solder material 52 that is in the melted state, Cu that has dissolved into the Sn-based solder material 52 from the conductor spacer 20 in the step of melting the Sn-based solder material 52 moves onto the upper surface 16a of the upper electrode 16 of the semiconductor element 12. Then, as shown in FIG. 6, while the Sn-based solder material 52 solidifies, $(CuNi)_6Sn_5$ (reference sign 40) is generated on the upper surface 16a of the upper electrode 16. The semiconductor element 12 and the solder layer 28 (i.e., the Sn-based solder material 52 that has solidified) are thereby connected firmly to each other. This $(Cu,Ni)_6Sn_5$ covers the upper surface 16a (the Ni-based metal) of the upper electrode 16 to thereby function as a barrier layer that suppresses interdiffusion of Ni in the upper electrode 16 and Sn in the solder layer 28 (i.e., generation of $Ni_3Sn_4$).

Moreover, Ni that has dissolved into the Sn-based solder material 52 from the upper electrode 16 in the step of melting the Sn-based solder material 52 moves onto the lower surface 20a of the conductor spacer 20. Then, as shown in FIG. 6, while the Sn-based solder material 52 solidifies, $Cu_3Sn$ (reference sign 42) and $(Cu,Ni)_6Sn_5$ (reference sign 44) are generated on the lower surface 20a of the conductor spacer 20. The conductor spacer 20 and the solder layer 28 (i.e., the Sn-based solder material 52 that has solidified) are thereby connected firmly to each other. This $(Cu,Ni)_6Sn_5$ covers the lower surface 20a of the conductor spacer 20 to thereby function as a barrier layer that suppresses growth of $Cu_3Sn$.

As described above, through the above-described steps, the laminated structure configured of the semiconductor element 12 and the conductor spacer 20 with the solder layer 28 therebetween, which is shown in FIGS. 1 and 2, can be obtained. As mentioned above, the semiconductor element 12 and the lower lead frame 24 can be bonded via the solder layer 32 by performing steps similar to the above-described steps. Namely, through the steps similar to the above-described steps, a laminated structure shown in FIG. 2 can be obtained, in which $(Cu,Ni)_6Sn_5$ (reference sign 46) is generated on a lower surface 18a of the lower electrode 18 of the semiconductor element 12 and $Cu_3Sn$ (reference sign 48) and $(Cu,Ni)_6Sn_5$ (reference sign 50) are generated on an upper surface 24a of the lower lead frame 24.

As described above, in the manufacturing method of the present embodiment, the lower surface 20a of the conductor spacer 20, which is one of members to be bonded, supplies Cu for generating $(Cu,Ni)_6Sn_5$ on the upper surface 16a of the upper electrode 16 constituted of the Ni-based metal. This eliminates the conventional need to separately provide a Cu layer that serves as a Cu source. Accordingly, $(Cu,Ni)_6Sn_5$ can be more easily generated on the upper surface 16a of the upper electrode 16. Since $(Cu,Ni)_6Sn_5$ serves as a barrier for the upper surface 16a of the upper electrode 16, diffusion of Ni atoms from the upper surface 16a of the upper electrode 16 can be suppressed.

Moreover, in the manufacturing method of the present embodiment, Cu is supplied from the conductor spacer 20 while the Sn-based solder material 52 is melted. The concentration of Cu in the Sn-based solder material 52 thus increases while the Sn-based solder material 52 is melted. Therefore, even if the concentration of Cu in the Sn-based solder material 52 before the bonding step is relatively low, a desired amount of $(Cu,Ni)_6Sn_5$ can be generated on the upper surface 16a of the upper electrode 16. Sn-Based solder with a higher concentration of Cu has a higher melting temperature. In the manufacturing method of the present embodiment, the concentration of Cu in the Sn-based solder material 52 before the bonding step can be set low, which allows the melting temperature of the Sn-based solder material 52 to be low. This can reduce an amount of energy consumption required for the bonding step. Moreover, an influence on various members heated together with the Sn-based solder material 52 can be mitigated.

Moreover, a saturated solubility in the Sn-based solder material 52 depends on a temperature at which the Sn-based solder material 52 is melted. Therefore, by adjusting the temperature at which the Sn-based solder material 52 is melted, the dissolution amount of Cu supplied from the conductor spacer 20 can be adjusted. This can suppress excessive consumption of Cu of the conductor spacer 20.

Figure 7A:
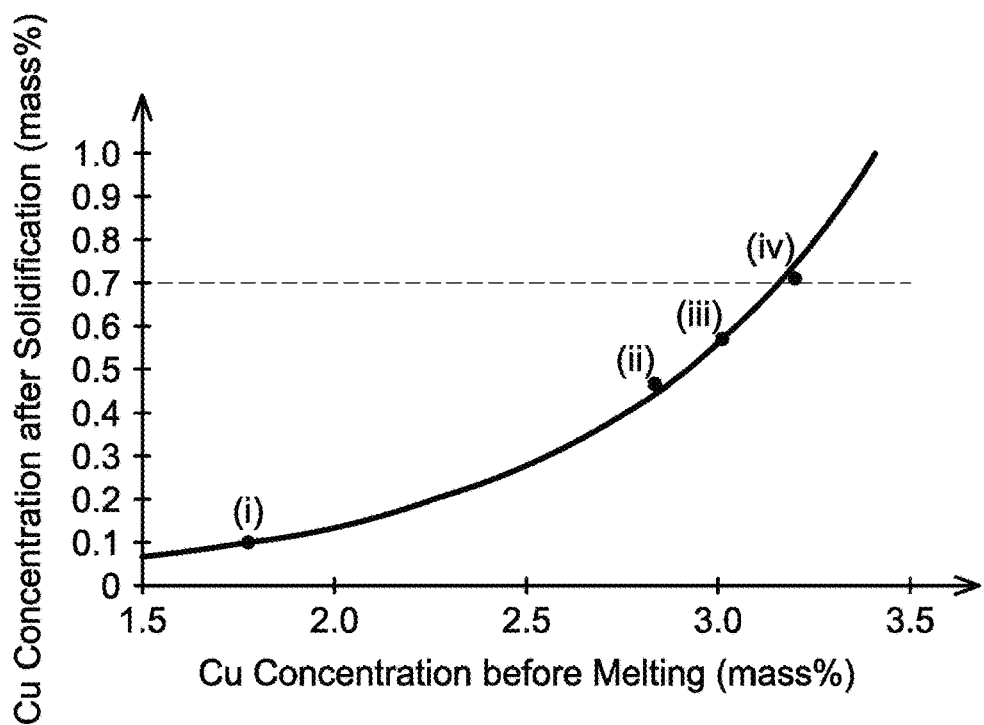
FIG. 7A is a graph showing a relation between concentrations of Cu in Sn—Cu solder 72 before and after bonding of an Ni film 70 and the Sn—Cu solder 72.

Next, the concentration of Cu in the solder layer after the bonding step will be discussed. FIGS. 7A to 7E show results of experiments conducted by the inventor of the present disclosure. FIG. 7A shows a relation between concentrations of Cu in solder 72 constituted of an Sn—Cu-based metal (hereinafter termed Sn—Cu solder 72) before and after bonding of a Ni film 70 and the Sn—Cu solder 72 (i.e., before melting of the Sn—Cu solder 72 and after solidification thereof (after bonding)). Moreover, FIGS. 7B to 7E show electron micrographs of an interface between the Ni film 70 and the Sn—Cu solder 72 after the bonding thereof, respectively for concentrations of Cu at points (i) to (iv) in FIG. 7A. These experiments were conducted using a Ni—P electroless plating layer as the Ni film 70.

Figure 7B:
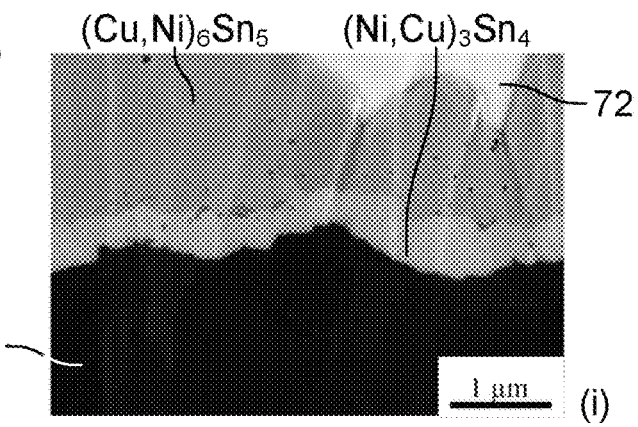
FIG. 7B is an electron micrograph of an interface between the Ni film 70 and the Sn—Cu solder 72 after the bonding thereof (which corresponds to (i) in FIG. 7A).
Figure 7C:
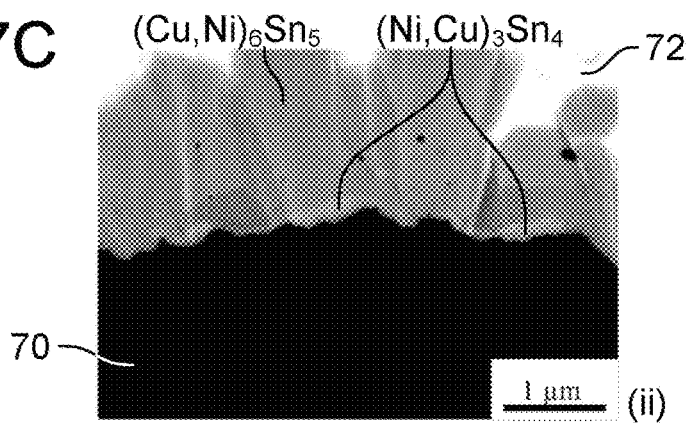
FIG. 7C is an electron micrograph of the interface between the Ni film 70 and the Sn—Cu solder 72 after the bonding thereof (which corresponds to (ii) in FIG. 7A).
Figure 7D:
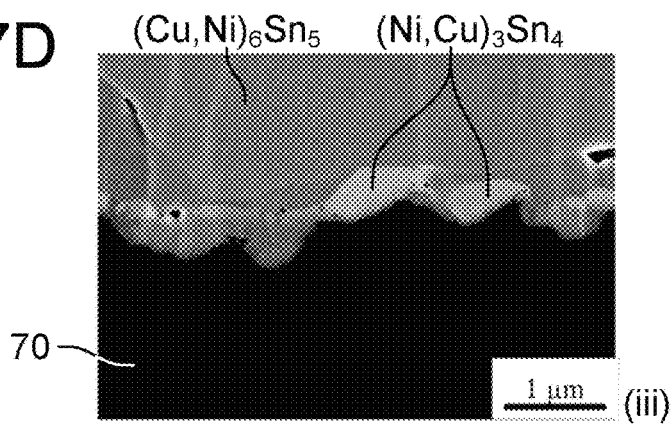
FIG. 7D is an electron micrograph of the interface between the Ni film 70 and the Sn—Cu solder 72 after the bonding thereof (which corresponds to (iii) in FIG. 7A).
Figure 7E:
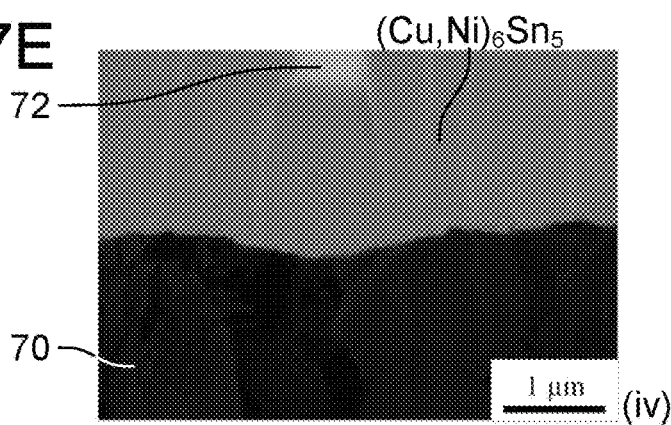
FIG. 7E is an electron micrograph of the interface between the Ni film 70 and the Sn—Cu solder 72 after the bonding thereof (which corresponds to (iv) in FIG. 7A).

As shown in FIGS. 7B to 7D, it was confirmed that when the concentration of Cu in the Sn—Cu solder 72 after the bonding was less than 0.7 mass %, not only $(Cu,Ni)_6Sn_5$ but also $(Ni,Cu)_3Sn_4$ was generated at the bonding interface. On the other hand, as shown in FIG. 7E, it was confirmed that when the concentration of Cu in the Sn—Cu solder 72 after the bonding was 0.7 mass % or more, $(Ni,Cu)_3Sn_4$ was not generated at the bonding intertface and only $(Cu,Ni)_6Sn_5$ was generated there.

The experiment results confirmed that, even when the concentration of Cu in the Sn—Cu solder 72 after the bonding is less than 0.7 mass %, $(Cu,Ni)_6Sn_5$ that functions as a barrier layer is generated. Then, an influence of $(Ni,Cu)_3Sn_4$, which is generated when the concentration of Cu in the Sn—Cu solder 72 after the bonding is less than 0.7 mass %, on the bonding interface will hereinafter be further discussed.

Figure 8A:
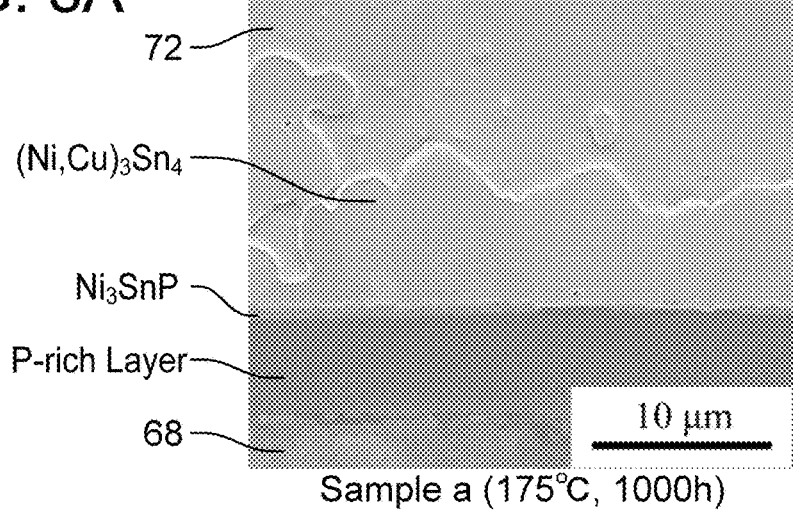
FIG. 8A is an electron micrograph of a bonding interface in a sample a after a high-temperature endurance test on the sample a (175° C., 1000 hrs.)
Figure 8B:
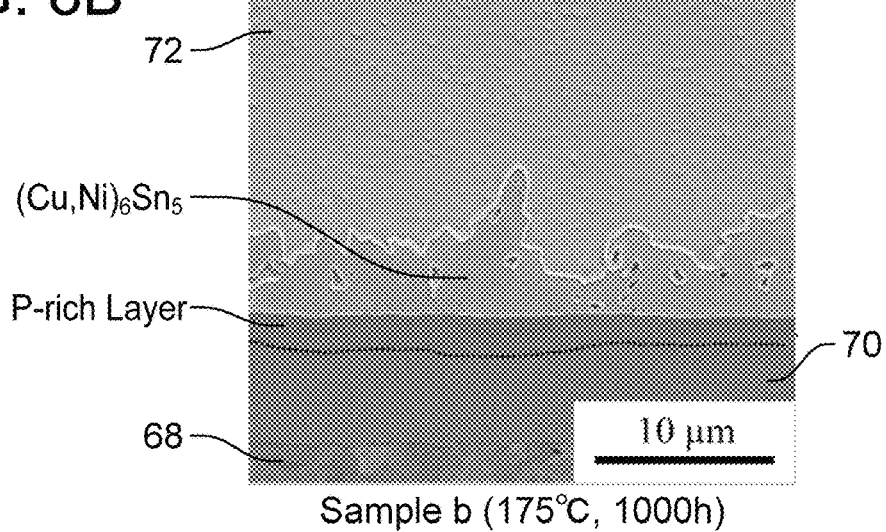
FIG. 8B is an electron micrograph of a bonding interface in a sample 13 after a high-temperature endurance test on the sample (175° C., 1000 hrs.).
Figure 8C:
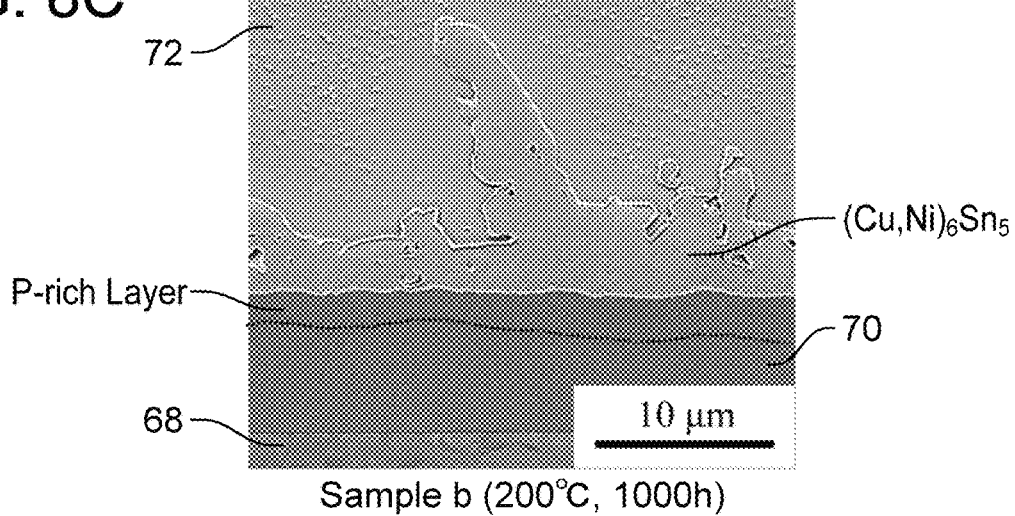
FIG. 8C is an electron micrograph of the bonding interface in the sample b after another high-temperature endurance test on the sample b (200° C., 1000 hrs.)

FIGS. 8A to 8C show results of experiments conducted by the inventor. For these experiments, a sample a and a sample b were prepared. In the sample a, $(Ni,Cu)_3Sn_4$ had been generated at a bonding interface between the Sn—Cu solder 72 and a Cu member 68 having its surface provided with the Ni film 70. In the sample b, $(Cu,Ni)_6Sn_5$ had been generated at a bonding interface between the Sn—Cu solder 72 and the Cu member 68 having its surface provided with the Ni film 70. These samples then underwent a high-temperature endurance test of placing the samples under high-temperature atmosphere of 175° C. for 1000 hours. Moreover, in addition to the above-described test, the sample b further underwent another high-temperature endurance test of placing the sample under high-temperature atmosphere of 200° C. for 1000 hours. FIGS. 8A to 8C show electron micrographs of the bonding interfaces in the samples after the high-temperature endurance test(s) on the samples.

In the sample a, as is observed from FIG. 8A, the Ni film 70 almost completely disappeared after the high-temperature endurance test at 175° C. for 1000 hours. Moreover, it was confirmed that a $Ni_3SnP$ layer was generated and a P-rich layer ($Ni_3P$ layer) significantly grew. Here, a thickness of the P-rich layer was correlated with an amount of Ni consumed from the Ni film 70, and a larger thickness of the P-rich layer indicates that a larger amount of Ni was consumed from the Ni film 70. In contrast to this, in the sample b, as is observed from FIGS. 8B and 8C, it was confirmed that the Ni film 70 remained and growth of the P-rich layer was suppressed even after the high-temperature endurance tests at 175° C. for 1000 hours and at 200° C. for 1000 hours. These results lead to a conclusion that in a semiconductor device that includes a bonding interface where only $(Cu,Ni)_6Sn_5$ is provided between the Ni film 70 and the Sn—Cu solder 72, disappearance of the Ni film 70 can be suppressed and thus the semiconductor device can suitably endure repetitive heat generation caused by an operation of the semiconductor device.

As described above, by setting the concentration of Cu in the solder layer 28 (the Sn-based solder material 52 after solidification) to 0.7 mass % or more, a suitable barrier layer can be generated. The concentration of Cu in the solder layer 28 can be adjusted by adjustment of a dissolution amount of Cu into the Sn-based solder material 52 in the bonding step. As shown in FIG. 7A, if the solder material has a concentration of Cu of approximately 3.2 mass % or more before incited, Cu can remain in the concentration of 0.7 mass % or more. Here, in the bonding step, while the Sn-based solder material 52 is melted, Cu dissolves into the Sn-based solder material 52 from the conductor spacer 20 and $(Cu,Ni)_6Sn_5$ starts to be generated on the upper surface 16a of the upper electrode 16. Namely, while the Sn-based solder material 52 is melted, supply of Cu from the conductor spacer 20 and consumption of Cu due to the generation of $(Cu,Ni)_6Sn_5$ can proceed simultaneously. Therefore, by increasing the concentration of Cu to approximately 3.0 mass % or more while the Sn-based solder material 52 is melted in the bonding step, the solder layer 28 having the concentration of Cu of 0.7 mass % or more can be achieved.

Figure 9A:
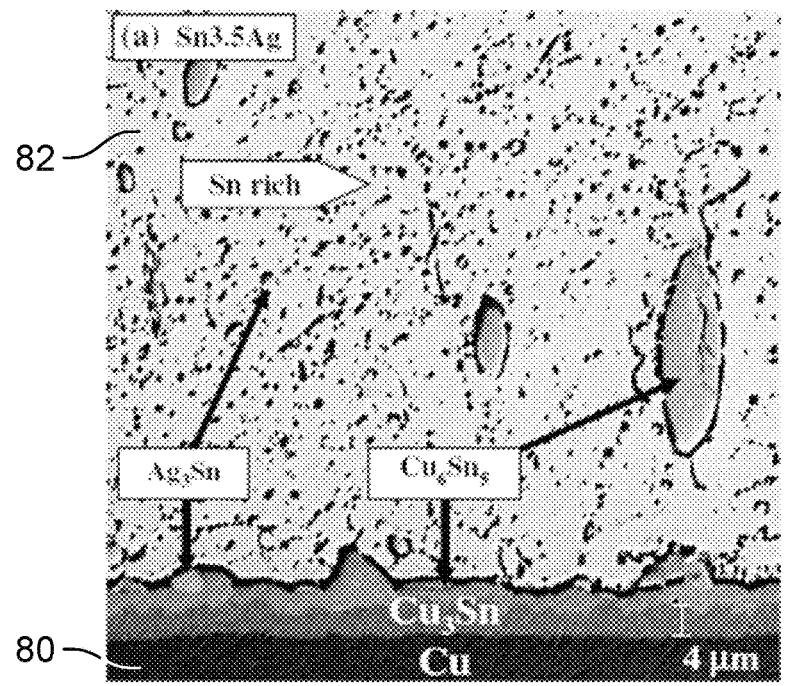
FIG. 9A is an electron micrograph of an interface between a Cu member 80 and Sn—Ag solder 82 (Sn-3.5Ag) after bonding thereof.
Figure 9B:
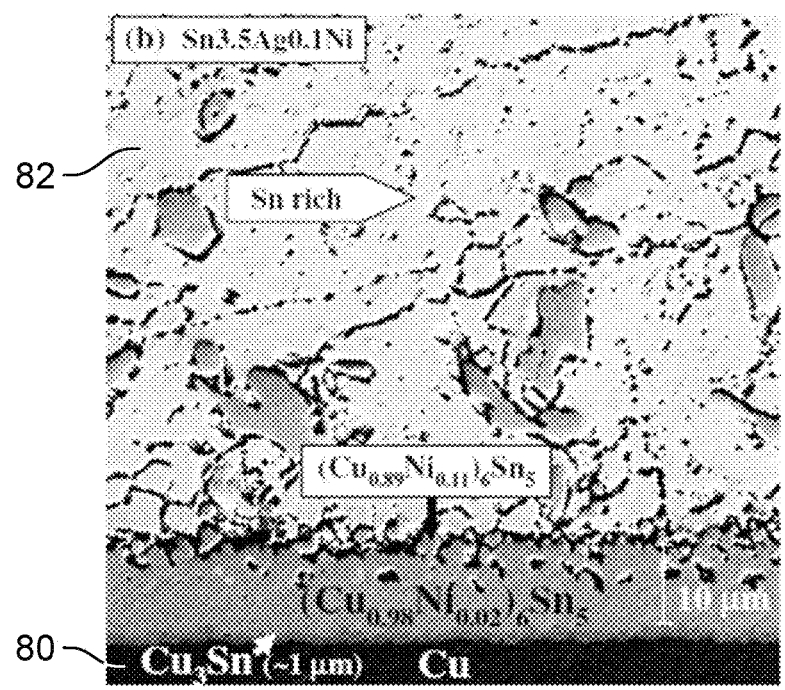
FIG. 9B is an electron micrograph of an interface between the Cu member 80 and Sn—Ag solder 82 (Sn-3.5Ag-0.1Ni) after the bonding thereof.

Next, an intermetallic compound generated at a bonding interface between the conductor spacer 20 and the solder layer 28 will be discussed. FIGS. 9A and 9B each show an electron micrograph of a bonding interface between a Cu member 80 and solder 82 constituted of an Sn—Ag-based metal (hereinafter termed Sn—Ag solder 82) (cited from C. E. Ho, S. C. Yang and C. R. Kao: J. Mater. Sci.: Mater. Electron. 18 (2007) 155-174). For the Sn—Ag solder 82 in FIG. 9A, a Sn-3.5Ag in which 3.5 mass % of Ag has been added to Sn is used as a solder material. Meanwhile, for the solder 82 in FIG. 9B, Sn-3.5Ag-0.1Ni in which 3.5 mass % of Ag and 0.1 mass % of Ni have been added to Sn is used as a solder material.

As shown in FIG. 9A, when the Sn—Ag solder 82 containing no Ni is used, $Cu_3Sn$ and $Cu_6Sn_5$ are generated in this order on an upper surface of the Cu member 80. On the other hand, as shown in FIG. 9B, when the Sn—Ag solder 82 having Ni added thereto is used, $(Cu,Ni)_6Sn_5$ is generated in place of $Cu_6Sn_5$ in FIG. 9A. Namely, a layer in which Ni atoms have substituted a part of Cu atoms in $Cu_6Sn_5$ is generated. Moreover, focusing on the $Cu_3Sn$ layers, a thickness of $Cu_3Sn$ in FIG. 9A is larger than a thickness of $Cu_3Sn$ in FIG. 9B. As such, it can be understood that adding Ni to the solder material causes generation of $(Cu,Ni)_6Sn_5$ and the presence of $(Cu,Ni)_6Sn_5$ suppresses growth of $Cu_3Sn$.

It is known that at a bonding interface between a member constituted of Cu and a member constituted of Sn, a diffusion speed of Cu into Sn is much higher than a diffusion speed of Sn into Cu. Due to this, between the Cu member and the Sn member, an intermetallic compound having the above-described composition of $Cu_3Sn$ is generated. At this time, because of the unbalanced interdiffusion of Cu and Sn through the bonding interface, atomic vacancies are generated in the Cu member at an interface between the Cu member and $Cu_3Sn$. If these atomic vacancies accumulate without disappearing, a so-called Kirkendall void is thereby generated. The generation of Kirkendall void results in a decrease in bonding strength. Therefore, growth of $Cu_3Sn$ should be suppressed.

As described above, when a layer constituted of $(Cu,Ni)_6Sn_5$ is provided on a surface of $Cu_3Sn$, this $(Cu,Ni)_6Sn_5$ functions as a barrier layer and growth of $Cu_3Sn$ is suppressed thereby. In the manufacturing method of the present embodiment, the upper surface 16a of the upper electrode 16 of the semiconductor element 12, which is one of the members to be bonded, supplies Ni for generating $(Cu,Ni)_6Sn_5$ on the lower surface 20a of the conductor spacer 20 constituted of Cu. Due to the dissolution of Ni into the Sn-based solder material 52, $Cu_3Sn$ and $(Cu,Ni)_6Sn_5$ are generated in this order on the lower surface 20a of the conductor spacer 20. Since $(Cu,Ni)_6Sn_5$ is generated on a surface of $Cu_3Sn$, growth of $Cu_3Sn$ is suppressed. Consequently, in the manufacturing method of the present embodiment, the Kirkendall void is less likely to be generated and suitable bonding strength between the conductor spacer 20 and the solder layer 28 can be achieved. $Cu_3Sn$ can grow also by repetitive heat generation due to an operation of the semiconductor device. However, since $(Cu,Ni)_6Sn_5$ is generated in the semiconductor device 10 of the present embodiment, interdiffusion of Cu and Sn is suppressed and growth of $Cu_3Sn$ is suppressed.

In the above-described embodiment, an RC-IGBT is adopted for the semiconductor element 12. In general, it is a known problem that in a semiconductor device, the above-described atomic diffusion is caused by electromigration (hereinafter termed EM) er thermomigration (hereinafter termed TM) and an electrode thereof is damaged thereby. EM is caused by a flow of electrons flowing in the electrode, and the level of EM increases in accordance with a temperature and a current density. TM is caused by a temperature gradient across the electrode and a component adjacent thereto (e.g., solder layer), and the level of TM increases in accordance with a temperature and the temperature gradient.

Figure 10:
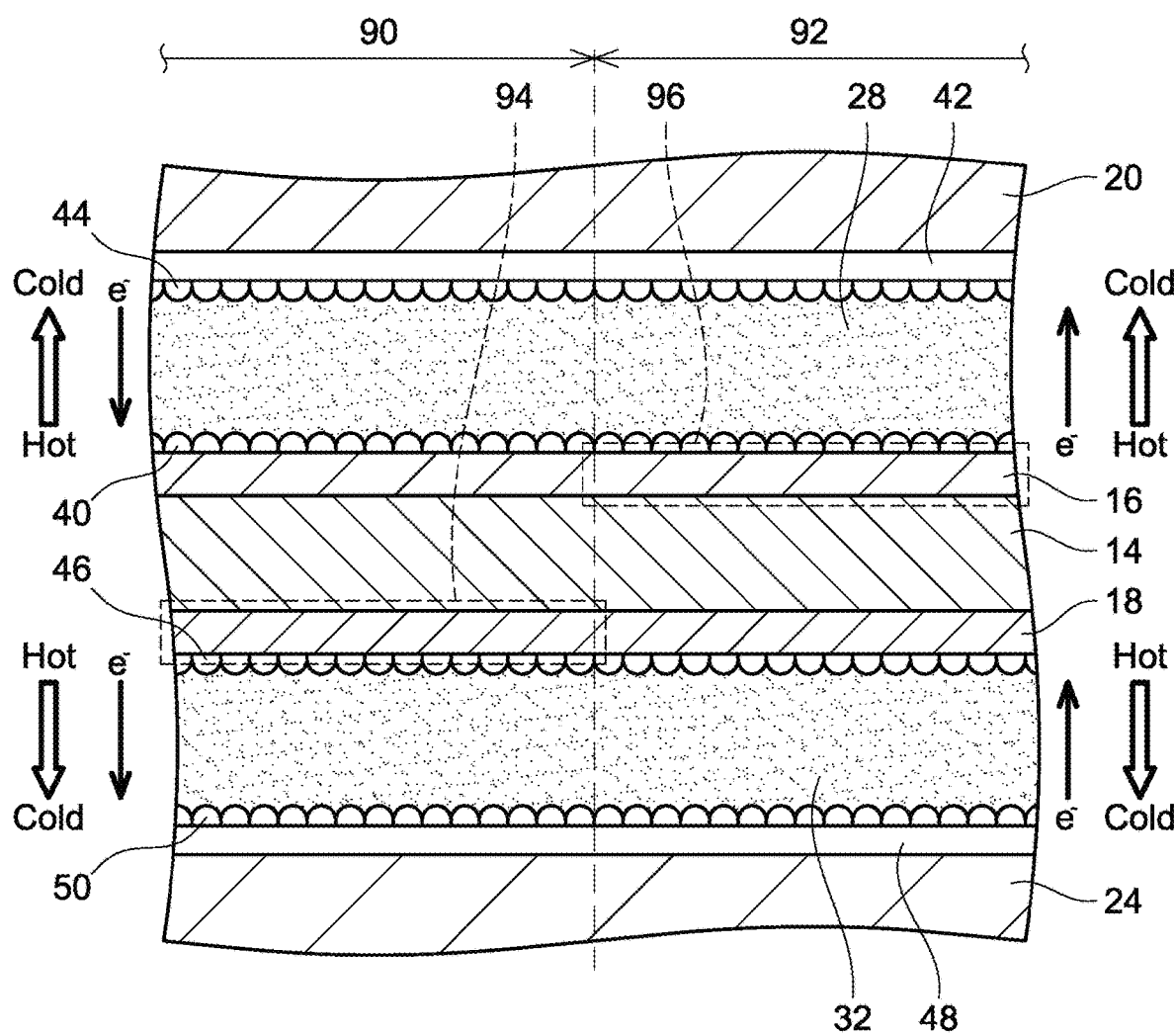
FIG. 10 is a diagram showing directions of flow of electrons and a temperature gradient in the semiconductor element 12.

As shown in FIG. 10, in the semiconductor element 12 including an IGBT region 90 and a diode region 92 as in the present embodiment, when it functions as an IGBT, a direction along which electrons flow coincides with a direction of temperature gradient on a lower electrode 18 side (a collector electrode side), as shown in a dashed-line region 94. Accordingly, damage on the lower electrode 18 is likely to proceed by both EM and TM. When the semiconductor element 12 functions as a diode, a direction along which electrons flow coincides with a direction of temperature gradient on an upper electrode 16 side (i.e., an anode electrode side), as shown in a dashed-line region 96. Accordingly, damage on the upper electrode 16 is likely to proceed by both EM and TM. Therefore, the technology disclosed herein is especially useful when applied to a semiconductor device that includes a range where atoms can diffuse due to both EM and TM.

(Correspondence Relationships)

The semiconductor element 12 is an example of a "first member". The conductor spacer 20 and the lower lead frame 24 are examples of a "second member". The upper surface 16a of the upper electrode 16 and the lower surface 18a of the lower electrode 18 are examples of "one surface of a first member". The lower surface 20a of the conductor spacer 20 and the upper surface 24a of the lower lead frame 24 are examples of "one surface of a second member".

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

What is claimed is:

1. A method of manufacturing a semiconductor device which comprises a plurality of members including a semiconductor element, the method comprising:
    disposing one surface of a first member which is one of the plurality of members and one surface of a second member which is another one of the plurality of members opposite to each other with a tin-based (Sn-based) solder material interposed therebetween; and
    bonding the first member and the second member by melting and solidifying the Sn-based solder material, wherein
    at least the one surface of the first member is constituted of a nickel-based (Ni-based) metal,
    at least the one surface of the second member is constituted of copper (Cu),
    in bonding the first member and the second member, $Cu_3Sn$ and $(Cu,Ni)_6Sn_5$ are generated in this order on the one surface of the second member while the Sn-based solder material solidifies, and
    the generated $(Cu,Ni)_6Sn_5$ contains Ni atoms derived from the Ni-based metal dissolved into the Sn-based solder material from the first member.

2. The method according to claim 1, wherein
in bonding the first member and the second member, $(Cu,Ni)_6Sn_5$ is generated on the one surface of the first member while the Sn-based solder material solidifies.

3. The method according to claim 1, wherein
bonding the first member and the second member includes holding a temperature of the Sn-based solder material for a predetermined time period within a temperature range higher than a melting temperature of the Sn-based solder material.

4. The method according to claim 3, wherein
in holding the temperature of the Sn-based solder material, a concentration of Cu in the Sn-based solder material is increased by dissolving copper from the one surface of the second member into melted Sn-based solder material.

5. The method according to claim 4, wherein
holding the temperature of the Sn-based solder material is performed under a condition that the concentration of Cu in the Sn-based solder material reaches 0.7 mass % or more.

6. The method according to claim 4, wherein
holding the temperature of the Sn-based solder material is performed under a condition that the concentration of Cu in the Sn-based solder material reaches 3.0 mass % or more.

7. The method according to claim 1, wherein
the first member is the semiconductor element including an electrode, and
the one surface of the first member is a surface of the electrode of the semiconductor element.

8. The method according to claim 1, wherein
the one surface of the first member is covered with a gold or silver film before bonding the first member and the second member, and
the gold or silver film diffuses into the Sn-based solder material while the Sn-based solder material is melted during bonding the first member and second member.

* * * * *